United States Patent [19]

Maa

[11] Patent Number: 4,990,995
[45] Date of Patent: Feb. 5, 1991

[54] LOW REFLECTANCE CONDUCTOR IN AN INTEGRATED CIRCUIT

[75] Inventor: Jer-shen Maa, Plainsboro Township, Middlesex County, N.J.

[73] Assignee: General Electric Company, Schenectady, N.Y.

[21] Appl. No.: 93,655

[22] Filed: Sep. 8, 1987

[51] Int. Cl.⁵ ............... H01L 23/48; H01L 29/46; H01L 29/62; H01L 29/64
[52] U.S. Cl. ........................ 357/67; 357/65; 357/71
[58] Field of Search ............... 357/59, 71, 67

[56] References Cited

U.S. PATENT DOCUMENTS

| | | | |
|---|---|---|---|
| 4,158,613 | 6/1979 | Sogo | 357/71 |
| 4,161,430 | 7/1979 | Sogo | 357/71 |
| 4,329,706 | 5/1982 | Crowder et al. | 357/67 |
| 4,417,387 | 11/1983 | Heslop | 357/71 |
| 4,531,144 | 7/1985 | Holmberg | 357/65 |
| 4,556,897 | 12/1985 | Yorikane et al. | 357/71 |
| 4,714,951 | 12/1987 | Baudrant et al. | 357/59 |

FOREIGN PATENT DOCUMENTS

| | | | |
|---|---|---|---|
| 56-80133 | 7/1981 | Japan | 357/71 |
| 59-22322 | 2/1984 | Japan | |
| 2087148 | 5/1982 | United Kingdom | 357/71 |

OTHER PUBLICATIONS

O'Toole et al., "Linewidth Control in Projection Lithography Using a Multilayer Resist Process", *IEEE Transactions on Electron Devices*, vol. ED-28, No. 11, Nov., 1981, pp. 1405-1410.

Primary Examiner—J. Carroll
Attorney, Agent, or Firm—Paul R. Webb, II; James C. Davis, Jr.

[57] ABSTRACT

A low reflectance conductor for an integrated circuit is disclosed. A layer of refractory metal is disposed over the aluminum alloy or silicide conductors commonly in use in integrated circuits. The layer of refractory metal is then treated in a plasma reactor to form a low reflective layer of refractory metal oxide on the surface.

4 Claims, 4 Drawing Sheets

LOW REFLECTANCE CONDUCTOR IN AN INTEGRATED CIRCUIT

The present invention relates to conductors in integrated circuit devices having low reflectance characteristics to enhance definition during optical lithography.

BACKGROUND OF THE INVENTION

Optical lithography is the patterning technology commonly used in making integrated circuits. The technology includes projection step-and-repeat exposure and alignment systems that produce high resolution images for producing micron and submicron size features. Since the tolerance of these optical systems is rather small, planarity of the integrated circuit device during the various stages of fabrication is important. Another important consideration, one to which this invention is directed, is the effects of the well known standing-wave phenomenon. This phenomenon effectively modulates the energy coupled into the layer of resist as a function of resist thickness and reflectance of the surface being coated. This effect is due primarily to multiple reflections from the aluminum metalization commonly used for interconnect wiring. The higher the reflectivity, the more pronounced the standing-wave effect. In device fabrication, the practical resolution of a projection aligner is limited by surface topology and reflectance of the substrate. On a planar and low reflectance substrate, micron and submicron features can be resolved by the current projection technology. On a nonplanar and highly reflective substrate, the standing-wave effect becomes severe and causes narrowing of the resist lines near the topographic steps. The minimum feature size degrades to approximately 1.5 μm. This standing-wave effect which is caused by multiple reflections from the substrate can be reduced by using a low reflectance substrate. The most desirable reflectance is between 20% and 40%. In this range, the multiple reflections is much reduced, while there is enough reflective light to allow accurate alignment and focusing of the projection aligners.

Interconnect wiring or metalization for integrated circuit devices, is typically aluminum, aluminum alloy, refractory metal and metal silicide, or doped polycrystalline silicon. There is shown in FIG. 1 a typical prior art arrangement, wherein an aluminum conductor 10 is disposed on a surface 12 of a semiconductor device 14. The surface 12 is typically a surface of a layer of insulating material such as silicon oxide, or areas of contact with silicon or other metals. The upper most surface 16, of the aluminum conductor 10 is usually highly reflective thereby giving rise to the standing-wave phenomenon. Another prior art structure is shown in FIG. 2 which differs from that shown in FIG. 1 only by the addition of a cap layer 18 of refractory metal on the surface 16. The purpose of this cap layer 18 is to increase electromigration resistance and reduce roughness. Where the cap layer 18 has a thickness of about 1000 angstroms, the formation of hillocks is substantially suppressed. The combined reflectance of the surface 16 of the aluminum conductor 10 and the surface 20 of the cap layer 18 is reduced somewhat from that of the surface 16 if the cap layer 18 was not present. This reflectance, depending on the thickness and material of the cap layer 18, can be no less than 40%.

What is needed is a low reflectance conductor suitable for integrated circuit device applications which does not greatly increase processing complexity.

SUMMARY OF THE INVENTION

The present invention relates to a low reflectance conductor for an integrated circuit device wherein the reflectance of the conductor is less than about 40%. The conductor includes a conductive layer, a layer of refractory metal on the conductive layer, and a layer of refractory metal oxide on a surface of the layer of refractory metal.

DESCRIPTION OF THE PREFERRED EMBODIMENT

Figure 1:
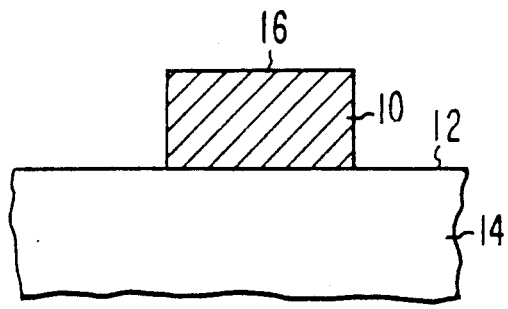
FIGS. 1 and 2 are cross-sectional views illustrating prior art conductors.
Figure 2:
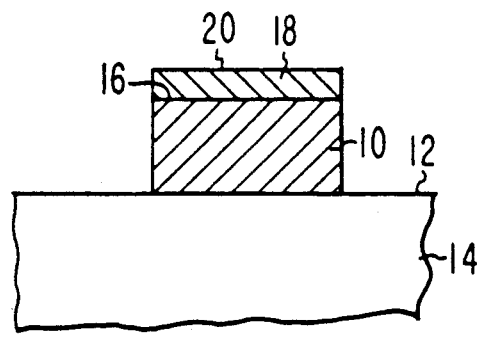
Figure 3:
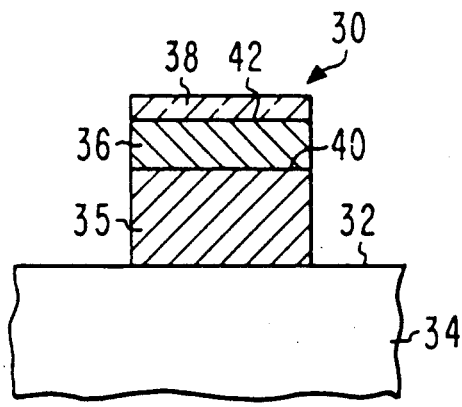
FIGS. 3 and 4 are cross-sectional views showing two embodiments of conductors in accordance with the teachings of the present invention.

There is shown in FIG. 3 a low reflectance conductor 30 disposed on a surface 32 of an integrated circuit device 34. The conductor 30 is a composite stack of three layers, a layer 35 of aluminum alloy having a surface 40, a layer 36 of refractory metal, and a layer 38 of refractory metal oxide. As with the prior art conductor shown in FIG. 2, the layer 34 of aluminum alloy is formed directly on the surface 12 which may be the surface of an insulating material, or areas of contact with silicon or other metals. The layer 34 may be made of pure aluminum or any aluminum alloy, in the present example it is made of aluminum alloy, with one percent silicon (Al-1%Si), and is formed by sputtering in the conventional way.

The layer 36 of refractory metal, such as titanium, tungsten, or an alloy of titanium and tungsten, is then formed on the surface 40 of the aluminum layer 34, again by sputtering techniques that are well known. The layer 36, which in the present example is titanium, should be about 1000 angstroms but not less than about 400 angstroms thick and should be deposited in the same pump-down cycle as the aluminum layer 34 to avoid oxidizing the surface 40. This layer 36 of titanium acts to reduce the reflectance of the composite layer from about 90% to about 50%.

The layer 38 of refractory metal oxide, shown in FIG. 3, is then formed on the surface 42 of the titanium layer 36 by treating the conductor 30 in a plasma reactor. Either a planar plasma (parallel plate) reactor or a plasma tunnel reactor may be used.

When using a planar plasma reactor, the reaction gas may be one of the following gases: $N_2$; $NH_3$ plasma; and $O_2$ plasma. When using $O_2$ plasma, the treatment is carried out at a temperature of about 260° C. and a pressure of about one torr for about 30 minutes. A power level of about 500 watts is used to generate the plasma in a way that is well known in the art. When using a plasma tunnel reactor the treatment is carried out in $O_2$ plasma at a pressure of about one torr for about 50 minutes. During this treatment, the temperature changes from room temperature to about 200° C. The layer 38 of titanium oxide formed under either of the conditions set forth above, acts to further reduce the reflectance of the conductor 30 to between about 20% and 40%. The planar plasma reactor, having a wider temperature range available, offers a somewhat lower reflectance than does the plasma tunnel reactor. By selectively adjusting the temperature and duration of treatment, any desired reflectance between 20% and 40% may be easily obtained.

Figure 4:
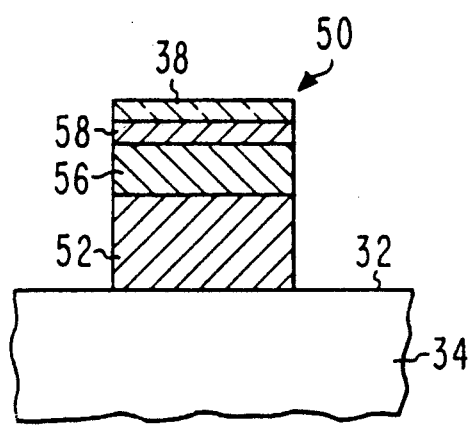

A second embodiment of the present invention is illustrated in FIG. 4. As shown in FIG. 4 a low reflective conductor 50 is disposed on a surface 32 of an integrated circuit device 34. The conductor 50 is a composite stack of four layers, a layer 52 of conductive material such as doped silicon, a layer 56 of refractory metal silicide, a thin layer 58 of refractory metal, and a layer 38 of refractory metal oxide. Elements of the conductor 50 having similar identifying numerals to corresponding elements of the conductor 30 are of the same materials and are made in the same way. This embodiment is useful for lowering the reflectivity of doped polycrystalline silicon gate electrodes and other doped silicon conductors having a refractory metal silicide surface.

The layer 58, as seen in FIG. 4, should be a similar refractory metal to that from which the layer 56 of refractory metal silicide was formed so that the two layers are compatible. Further, as will be appreciated by those skilled in the art, the two layers 56 and 58 may comprise a single layer of refractory metal which was heat treated to cause only the lower portion thereof to form silicide. Thus, the upper portion would remain as refractory metal and would correspond to the layer 58. The conductor 50 is then treated in a plasma reactor in a manner similar to that described above for the conductor 30, to form the layer 38 of the refractory metal oxide, shown in FIG. 4.

In both embodiments, the thickness of the layer 38 of refractory metal oxide should be from between about 100 angstroms to about 200 angstroms. In the case of the conductor 30 shown in FIG. 3, where the layer 36 is titanium, approximately 60 to 100 angstroms of the layer 36 will be consumed during the formation of the layer 38 of titanium oxide. It is desirable that the final thickness of the layer 36 of refractory metal be approximately 1000 angstroms but not less than about 300 angstroms necessitating that the starting thickness be a minimum of 360 angstroms and preferably about 1000 angstroms. If the layers 36 and 38 are too thin the reflectance of the conductor 30 will be significantly increased.

In the case of the conductor 50 shown in FIG. 4, where the layer 56 is titanium silicide, the starting thickness for the layer 58 of refractory metal could be as small as 60 angstroms, which would be completely consumed during formation of the layer 38 of refractory metal oxide. It is not important that the conductor 50 include the layer 58 since the layer 56 of silicide has a reflectance of about 50% which is similar to that of a layer of titanium. The only requirement here is that the layer 56 of silicide have a thickness of at least 300 angstroms and the final layer 38 of refractory metal oxide, titanium oxide in this example, have a minimum thickness of 60 angstroms. As a practical matter, however, to assure that the final layer 38 is of sufficient thickness, it would be preferable to provide a starting thickness of at least 100 angstroms for the layer 58.

Figure 5:
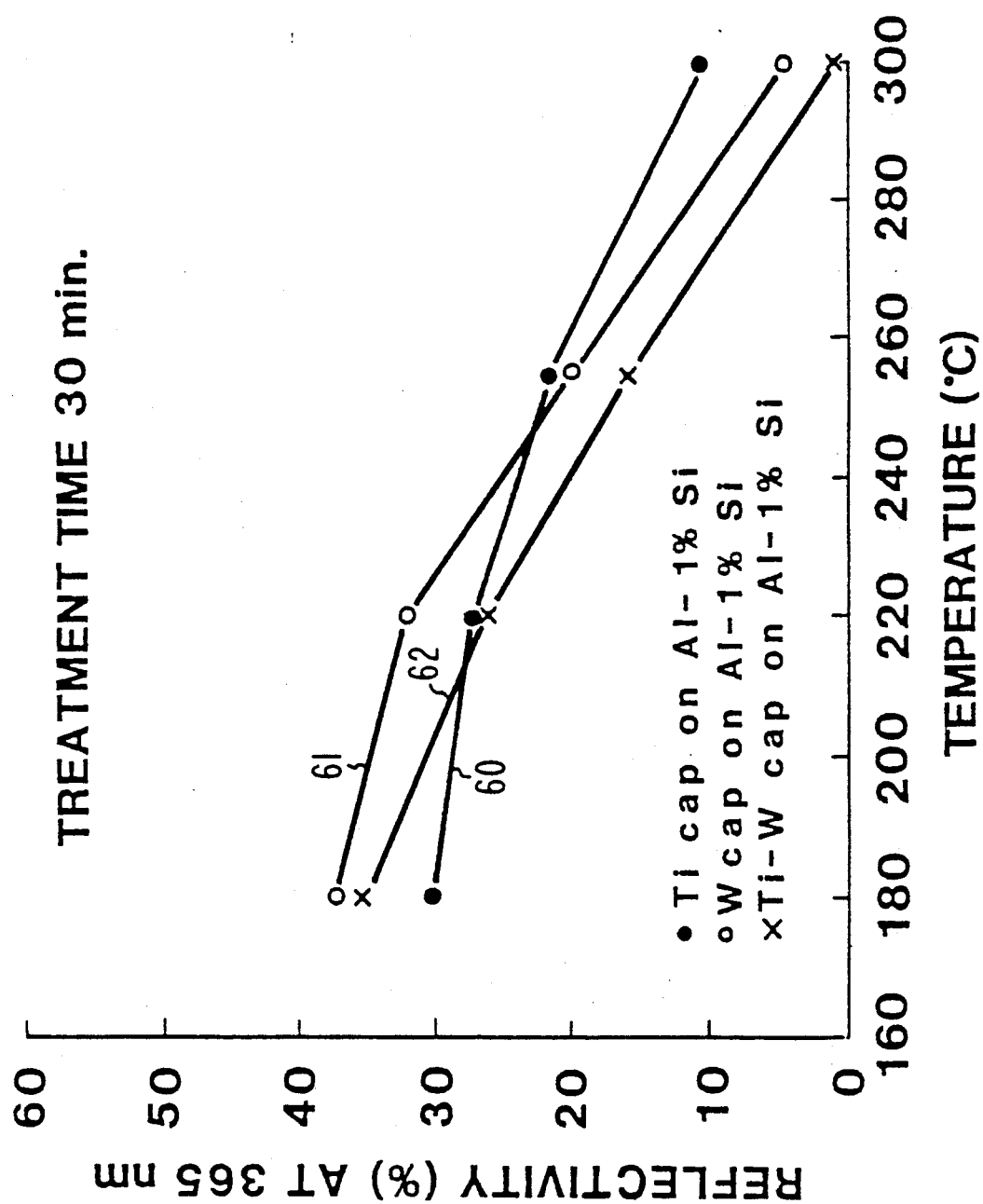
FIGS. 5, 6, and 7 show graphs which illustrate percent reflectance with respect to treatment temperature for various structures.
Figure 6:
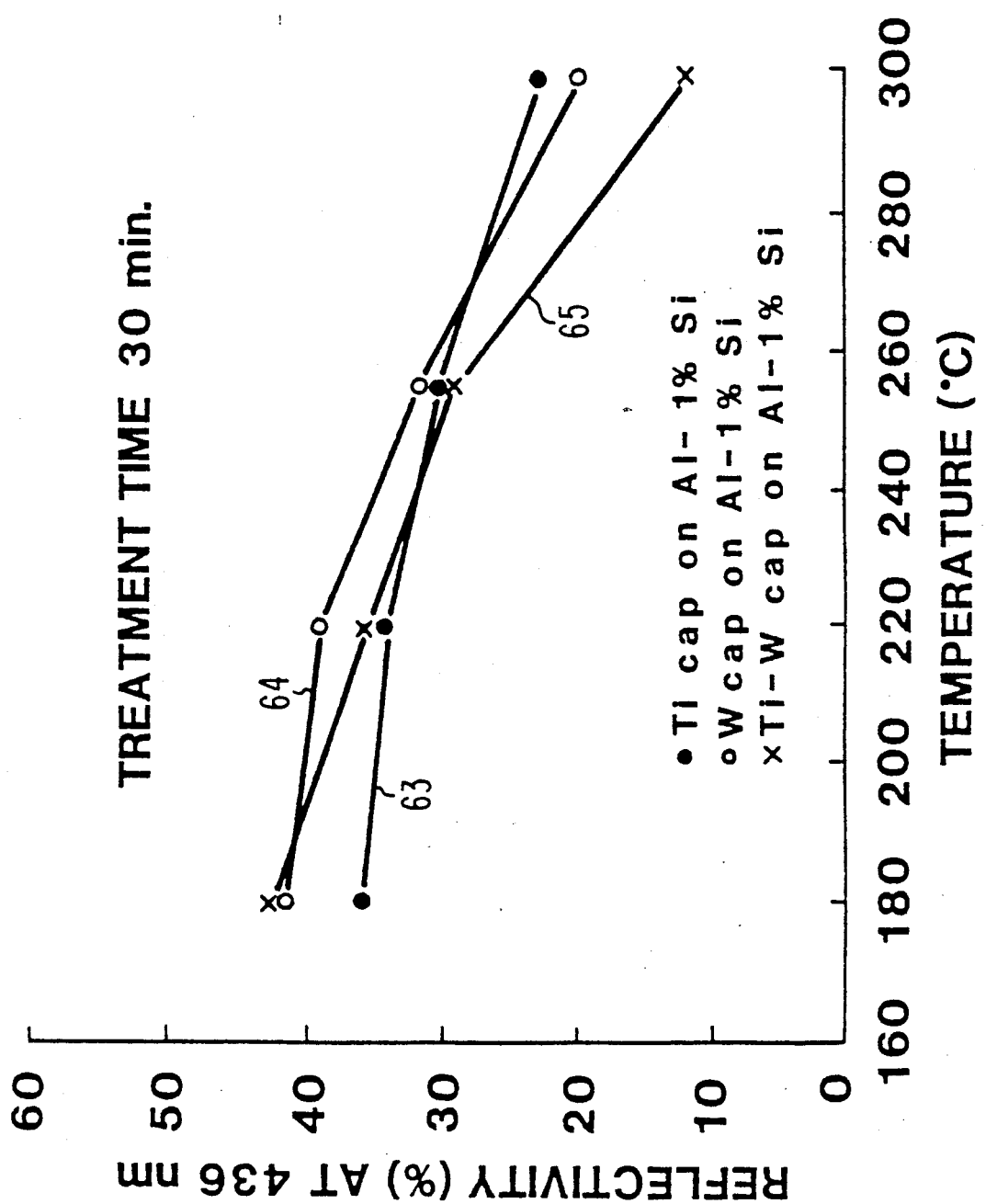
Figure 7:
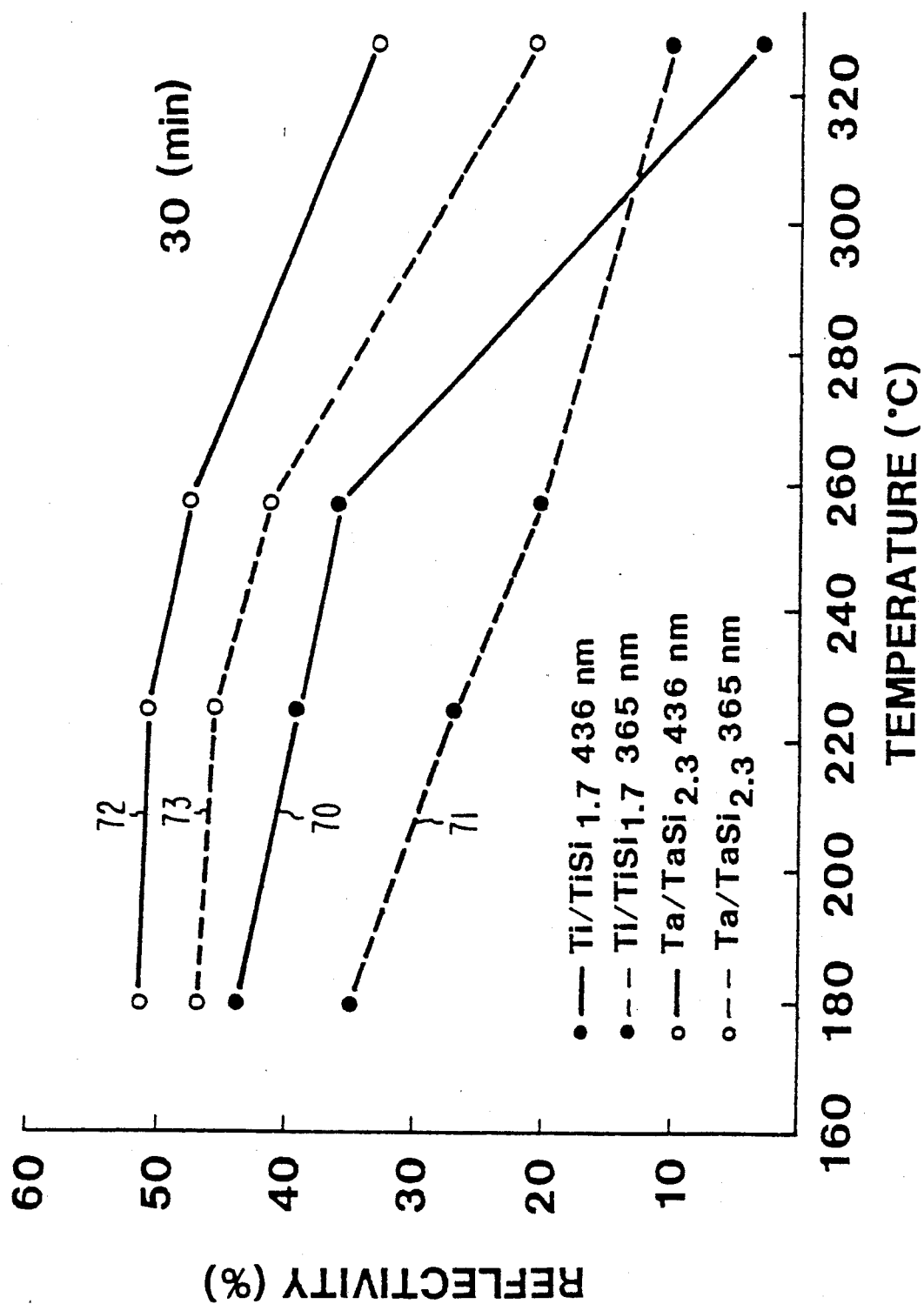

By way of example, FIGS. 5, 6, and 7 show graphs representing reflectance with respect to treatment temperature for various cap materials. In all cases the treatment was performed in a planar plasma reactor in $O_2$ plasma at a pressure of one torr for a period of 30 minutes. FIG. 5 shows three graphs 60, 61, and 62 which show reflectance at a wavelength of 365 nm of a titanium cap, a tungsten cap, and a 10% titanium 90% tungsten cap respectively. Four examples were tested for each cap material, one sample for each of the treatment temperatures of 180° C., 220° C., 255° C., and 300° C. As can be seen by the graph, the reflectance for these cap structures sharply decreases as the treatment temperature increases and can easily be controlled to yield any desired reflectance between 15% and 40%.

Similarly, FIG. 6 shows three graphs 63, 64, and 65 which show reflectance at a wavelength of 436 nm of the same samples used in the graphs 60, 61, and 62. Note that the reflectance at this longer wavelength is somewhat greater than the reflectance at 365 nm. However, reflectances between 20% and 40% are still easily achieved.

Additionally, four samples were tested for a titanium cap on a conductor of titanium silicide and plotted to form the graphs 70 and 71 in FIG. 7. The graph 70 shows the reflectance of the treated titanium cap over silicide for a wavelength of 435 nm while the graph 71 shows the reflectance of the same cap for a wavelength of Similarly, four samples were tested for a tantalum 365 nm. Similarly, four samples were tested for a tantalum cap on a conductor of tantalum silicide and plotted to form the graphs 72 and 73 in FIG. 7. The graph 72 shows the reflectance of the treated tantalum cap over silicide for a wavelength of 436 nm while the graph 73 shows the reflectance of the same cap for a wavelength of 365 nm.

The graphs of FIG. 7 illustrate that the reflectance of a tantalum cap on a conductor of tantalum silicide can be reduced to below 40% at 436 nm and below 25% at 365 nm. On the other hand, treatment of the titanium cap on a conductor of titanium silicide can yield any desired reflectance between 15% and 40%.

The important advantage of the present invention is that the reflectance of integrated circuit conductors may be precisely controlled to minimize the standing-wave effect. This substantially enhances the capability of the optical lithographic system to produce well defined submicron line structures.

What is claimed is:

1. In an integrated circuit, a low reflectance conductor having a reflectance of less than about 40% comprising:
   (a) a conductive layer;
   (b) a layer of refractory metal overlying said conductive layer and having a thickness of greater than about 300 angstroms; and
   (c) a layer of refractory metal oxide overlying said layer of refractory metal and having a thickness of between about 100 angstroms and about 200 angstroms.

2. The low reflectance conductor of claim 1 wherein said conductive layer is a layer of aluminum or aluminum alloy material.

3. The low reflectance conductor of claim 1 wherein said conductive layer is a composite of a layer of polycrystalline silicon and a layer of refractory metal silicide.

4. The low reflectance conductor of claim 3 wherein said layer of refractory metal is a similar metal to that from which said layer of refractory metal silicide is formed.

* * * * *